United States Patent [19]

Kaneko et al.

[11] 4,443,830
[45] Apr. 17, 1984

[54] CR COMPOSITE PART PROVIDED WITH DISCHARGE GAP

[75] Inventors: Toshimi Kaneko, Sabae; Yukio Hata, Fukui, both of Japan

[73] Assignee: Murata Manufacturing Co., Ltd., Japan

[21] Appl. No.: 480,336

[22] Filed: Mar. 30, 1983

[30] Foreign Application Priority Data

Apr. 6, 1982 [JP] Japan ............................ 57-50150[U]

[51] Int. Cl.³ ........................ H01G 1/11; H01L 27/02
[52] U.S. Cl. ....................................... 361/275; 357/51
[58] Field of Search ....................... 361/272, 275, 433; 357/51

[56] References Cited

U.S. PATENT DOCUMENTS

| | | | |
|---|---|---|---|
| 2,566,666 | 9/1951 | Khouri et al. | 361/275 X |
| 2,694,185 | 11/1954 | Kodama | 361/275 X |
| 2,828,454 | 3/1958 | Khouri | 361/275 X |
| 2,966,608 | 12/1960 | Magnusson et al. | 361/275 X |
| 3,316,467 | 4/1967 | Sperry | 361/275 |
| 3,745,430 | 7/1973 | Lundquist et al. | 361/275 X |
| 3,996,502 | 12/1976 | Bratschum | 361/272 X |

*Primary Examiner*—Donald A. Griffin
*Attorney, Agent, or Firm*—Ostrolenk, Faber, Gerb & Soffen

[57] ABSTRACT

The disclosure is directed to an improved CR composite part provided with a discharge gap, in which discharge electrodes are provided on opposite surfaces of a substrate formed with a CR composite circuit, while an opening is provided between confronting forward ends of the discharge electrodes on the respective surfaces of the substrate, so that electrical discharge between both of the discharge electrodes is effected through the space for the opening so as to prevent adhesion of foreign matters between the discharge electrodes and also, to effectively obstruct formation of undesirable stray capacitance for stable discharging characteristics.

11 Claims, 9 Drawing Figures

CR COMPOSITE PART PROVIDED WITH DISCHARGE GAP

BACKGROUND OF THE INVENTION

The present invention generally relates to an electrical part and more particularly, to a capacitance and resistance composite part or CR composite part (referred to as CR composite part hereinbelow) provided with a gap for electrical discharge.

In a conventional CR composite part of the above described type, it is so arranged, for example as shown in FIG. 1, that two electrode layers 2-1 and 2-2 are provided on one surface 1a of a substrate 1 made of a dielectric material, while a common electrode layer 3 is formed on the other surface 1b of said substrate 1 so as to form capacitors C1 and C2 between the electrode layers 2-1 and 3, and the electrode layers 3 and 2-2, with the respective electrode layers 2-1 and 2-2 being further formed with discharge electrode layers 4-1 and 4-2 confronting each other at corresponding forward ends thereof through a predetermined interval. The electrode layers 2-1 and 2-2 are further bridged by a resistant layer 5, and respectively connected to lead wires 11 and 12.

The CR composite part as referred to above may be represented by an equivalent circuit shown in FIG. 2.

In the known CR composite part as described above, however, since both of the discharge electrode layers 4-1 and 4-2 are provided on the same surface 1a of the substrate 1 for electrical discharge therebetween on said surface 1a, there have been such disadvantages that, if foreign matters such as dust and dirts, vapor, etc. in the atmosphere should adhere to the surface of the substrate 1 between the discharge electrodes 4-1 and 4-2, discharge starting voltage between said discharge electrodes 4-1 and 4-2 is unnecessarily lowered, with undesirable heating of such foreign matters during the electrical discharge. Moreover, owing to the fact that both of the discharge electrode layers 4-1 and 4-2 are disposed comparatively close to each other in the prior art arrangement as described above, a stray capacitance is formed therebetween, thus also resulting in an undesirable lowering of the discharge starting voltage. Accordingly, there have been required countermeasures such as enlargement of the gap between the discharge electrodes 4-1 and 4-2 or application thereto of a voltage withstanding reinforcing agent, thus making it difficult to reduce the size of the CR composite part by that extent, with consequent troublesome procedures and high cost required for manufacture thereof.

SUMMARY OF THE INVENTION

Accordingly, an essential object of the present invention is to provide an improved CR composite part provided with a discharge gap, in which discharge electrodes are provided on opposite surfaces of a substrate formed with a CR composite circuit, while an opening is provided between confronting forward ends of the discharge electrodes on the respective surfaces of the substrate, so that electrical discharge between both of the discharge electrodes is effected through the space for the opening, thereby to prevent adhesion of foreign matters between the discharge electrodes and also, to effectively obstruct formation of the undesirable stray capacitance thereof for stable discharging characteristics.

Another important object of the present invention is to provide a CR composite part of the above described type which is simple in construction and accurate in functioning at high reliability, and can be readily manufactured on a large scale at low cost.

In accomplishing these and other objects, according to one preferred embodiment of the present invention, there is provided a CR composite part having a discharge gap, which includes a substrate of dielectric material, a plurality of capacitor-forming electrodes respectively provided on opposite surfaces of the substrate so as to confront each other through said substrate held therebetween, a CR composite circuit constituted by bridging, through resistance, the predetermined electrodes of said plurality of capacitor-forming electrodes respectively provided on the same surfaces of said substrate and also by electrically connecting one predetermined electrode on one surface of said substrate to the other predetermined electrode on the other surface of said substrate, and two discharge electrodes which are respectively provided on the opposite surfaces of the substrate and connected to the electrode on the one surface of the substrate and the electrode on the other surface of said substrate, equivalent to input and output terminals of said CR composite circuit, and which are respectively provided with discharge end portions arranged to confront each other through a predetermined gap along the surfaces of said substrate. The substrate is further formed with an opening at a position equivalent to the discharge gap between said two discharge electrodes.

By the above arrangement according to the present invention, an improved CR composite part has been advantageously presented through simple construction, with substantial elimination of disadvantages inherent in the conventional CR composite parts of this kind.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
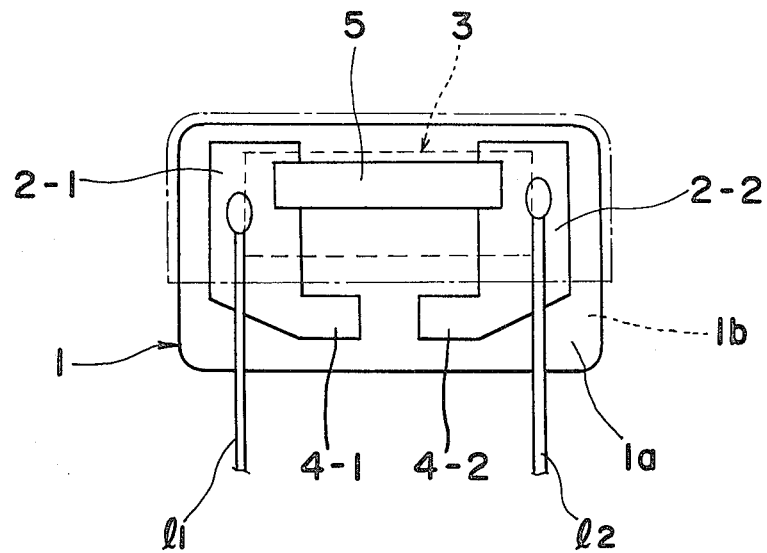
FIG. 1 is a schematic top plan view showing the construction of a conventional CR composite part provided with a discharge gap (already referred to)

Before the description of the present invention proceeds, it is to be noted that like parts are designated by like reference numerals throughout the accompanying drawings.

Figure 3:
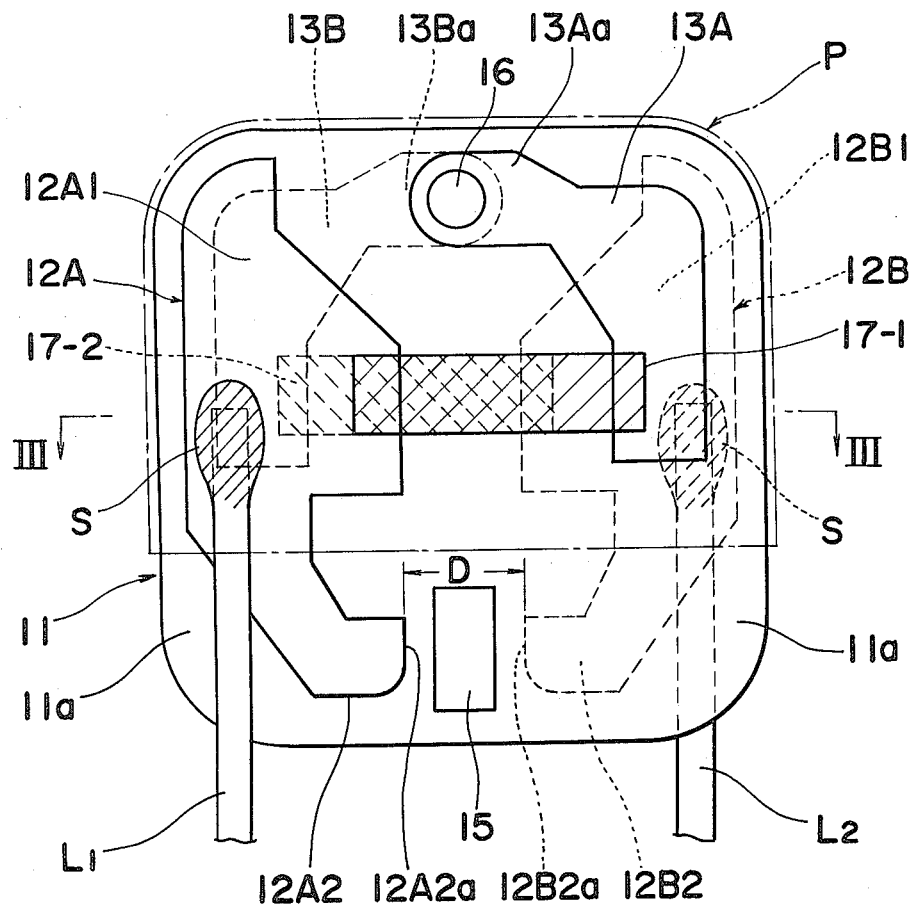
FIG. 3 is a top plan view of an improved CR composite part according to one preferred embodiment of the present invention as viewed from an upper surface thereof.
Figure 4:
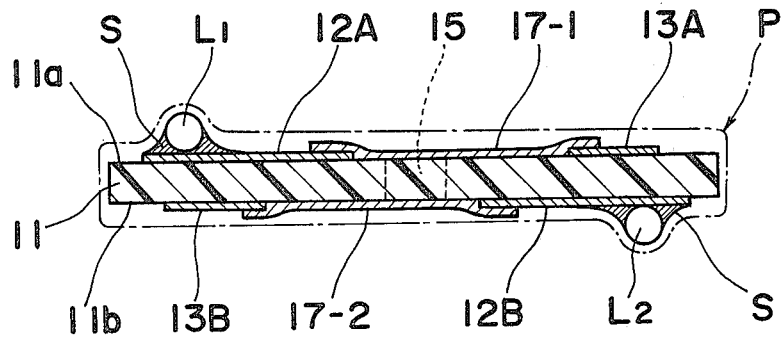
FIG. 4 is a cross section taken along the line III—III in FIG. 3.

Referring now to the drawings, there is shown in FIGS. 3 and 4, a CR composite part provided with a discharge gap, according to one preferred embodiment of the present invention, which generally includes a substrate 11 in an approximately square configuration, and electrode layers provided on opposite surfaces thereof in a manner as described in detail hereinbelow.

The substrate 11 is prepared by sintering a dielectric material such as barium titanate and the like in the square shape, and may be formed into any other configurations, for example, a rectangular or circular shape depending on necessity, although not particularly shown.

At the left side on the upper surface 11a of the substrate 11 in FIG. 3, there is provided a first electrode 12A in a thin layer configuration including an electrode 12A1 which constitutes a capacitor C1 and is integrally formed with a discharge electrode 12A2, while, at the right side of said upper surface 11a, another electrode 13A which forms a capacitor C2 is provided. On the other hand, at the left side on the under surface 11b of said substrate 11, an electrode 13B having the same shape as the above electrode 13A and confronting the electrode 12A1 on the upper surface 11a so as to form the capacitor C1 (FIG. 5), is formed, while, at the right side on said under surface 11b, there is provided a second electrode 12B in the same thin layer configuration as the first electrode 12A and including an electrode 12B1 which confronts the electrode 13A on the upper surface 11a and is integrally formed with the discharge electrode 12B2.

The forward end portion 12A2a of the discharge electrode 12A2 on the upper surface 11a is arranged to confront the corresponding forward end portion 12B2a of the discharge electrode 12B2 on the under surface 11b through a predetermined interval D, with a rectangular opening 15 being formed in the substrate 11 in a position between said forward end portion 12A2a of the discharge electrode 12A2 on the upper surface 11a and said forward end portion 12B2a of the discharge electrode 12B2 on the under surface 11b, so that upon impression of an abnormal voltage between said discharge electrodes 12A2 and 12B2 as described in detail later, an electrical discharge path may be formed through the space for the opening 15.

It should be noted here that the opening 15 as referred to above need not necessarily be limited to a through-hole, but may be in the form of a notch (not shown) formed by cutting out the substrate 11 at its edge portion, while, configuration of such opening or notch may be suitably determined as described, and that the sizes of the interval D and the opening 15 may be properly selected according to withstanding voltage value with respect to abnormal voltages in the CR composite part to be dealt with.

One end 13Aa of the electrode 13A provided on the upper surface 11a of the substrate 11 is arranged to overlap corresponding one end 13Ba of the electrode 13B formed on the under surface 11b through said substrate 11, while a through-hole 16 is formed in the overlapped ends 13Aa and 13Ba of the electrodes 13A and 13B so as to extend through the substrate 11. An electrically conductive paint (not particularly shown) is applied onto the inner peripheral surface of the through-hole 16 for electrical connection between the electrodes 13A and 13B as shown at A in an electrical equivalent diagram of FIG. 5.

It is needless to say that the electrically conductive paint referred to above may be replaced by an electrically conductive metallic foil, electrically conductive eyelet ring or the like.

Furthermore, on the upper surface 11a of the substrate 11, the electrodes 12A1 and 13A are bridged each other through a resistant layer 17-1 having a resistance value R1, while on the under surface 11b thereof, the electrodes 12B1 and 13B are connected to each other through another resistant layer 17-2 with a resistance value R2.

Figure 5:
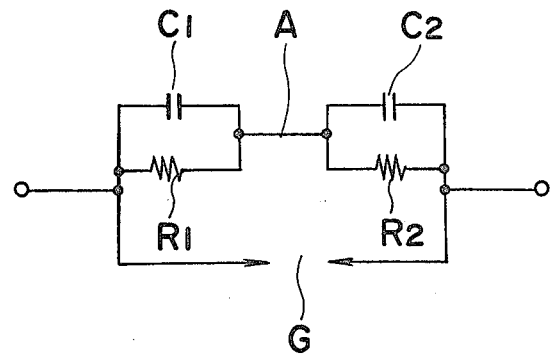
FIG. 5 is an electrical equivalent circuit diagram of the CR composite part of FIG. 3.

In the above construction, as shown in FIG. 5, a C1R1 parallel circuit including a parallel connection of the capacitor C1 which is formed by the electrode 12A1 of the first electrode 12A and the electrode 13B, together with the portion of the substrate 11 held therebetween, and the resistance R1 of the resistant layer 17-1, and a C2R2 parallel circuit including a parallel connection of capacitor C2 which is formed by the electrode 12B1 of the second electrode 12B and the electrode 13B, together with the portion of the substrate 11 held therebetween, and the resistance R2 of the resistant layer 17-2, are connected in series to each other through the connecting portion at the through-hole 16 described earlier, thus constituting the integral CR composite circuit on the substrate 11.

Moreover, lead wires L1 and L2 are respectively connected to the first and second electrodes 12A and 12B, for example, by soldering as at S, while, as shown by chain lines in FIGS. 3 and 4, the portion of the substrate 11 excluding the discharge portion is covered with a resinous material P, for example, by a known dipping method.

Figure 6:
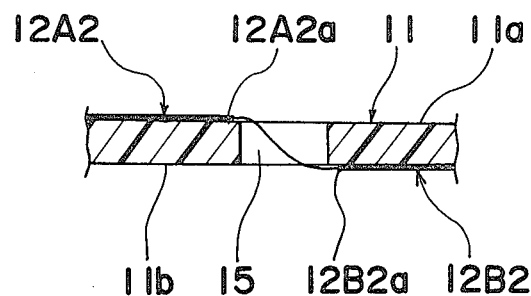
FIG. 6 is a fragmentary side sectional view showing the state during the electrical discharge in the CR composite part of FIG. 3, FIGS. 7 and 8 are graphs showing data of comparative performance tests between the CR composite part according to the present invention and the conventional CR composite part.

By the above arrangement, on the assumption that a signal including an abnormal voltage higher than a voltage determined by the size of the discharge gap G is impressed between the lead wires L1 and L2, electrical discharge takes place through the space for the opening 15, between the forward end 12A2a of the discharge electrode 12A2 on the one surface 11a of the substrate 11 and the corresponding forward end 12B2a of the discharge electrode 12B2 on the other surface 11b of said substrate 11 in a manner as shown in FIG. 6 for removal of the abnormal voltage by the above electrical discharge. Meanwhile, the normal signal component is derived from the lead wire L2, through the lead wire L1, the first electrode 12A, the CR composite circuit composed of the parallel circuit of the capacitor C1 and resistance R1 and the parallel circuit of the capacitor C2 and resistance R2, and further, via the second electrode 12B.

On the other hand, in the case where abnormal component is not contained in the above signal, no electrical discharge takes place between the discharge electrodes 12A2 and 12B2.

Figure 2:
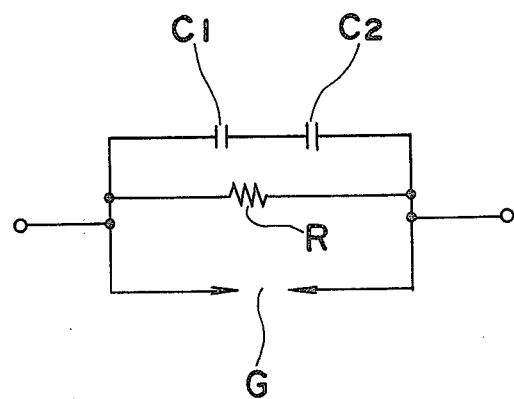
FIG. 2 is an electrical equivalent circuit diagram for the CR composite part of FIG. 1 (already referred to)
Figure 7:
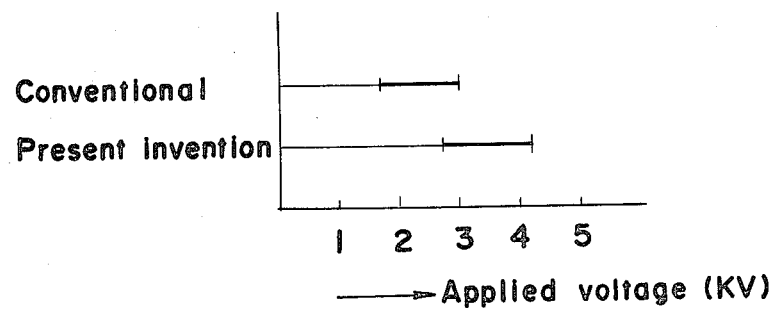
Figure 8:
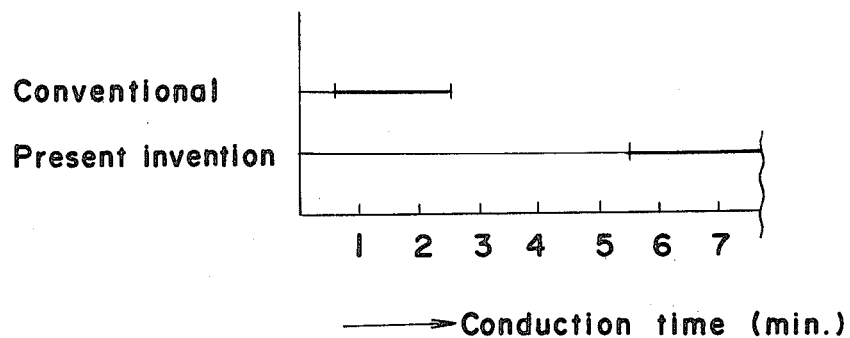

Reference is also made to FIGs. 7 and 8 showing comparative test data in performance between the CR composite part according to the present invention described so far and the conventional CR composite part as shown in FIGS. 1 and 2.

In the above comparative tests, the samples for the CR composite part according to the present invention and those for the conventional CR composite part were arranged to have the same composite capacitance value, composite resistance value, and length of the discharge gap G in the composite circuits.

With employment of the samples as described above, upon comparison of discharge starting voltage characteristics through impression of AC high voltages respectively to the sample CR composite parts according to the present invention and the sample CR composite parts of the conventional type, it was possible, in the samples of the present invention, to increase the discharge starting voltage by approximately 1 KV higher than that in the conventional samples. In other words, in the CR composite parts according to the present invention, the undesirable formation of stray capacitance at the discharge portion was advantageously prevented, with a consequent reduction of voltage drop resulting from such stray capacitance.

Moreover, as a result of conduction tests at the discharge portions of the respective samples as carried out under such conditions that voltages were applied across the input and output terminals of said samples to render the current flowing through the discharge portion to be 30 mA, it was found that, as shown in FIG. 8, although the conventional CR composite part samples became unusable, with the discharge portions being short-circuited in approximately 2.5 minutes, the CR composite part samples of the present invention were free from such short-circuiting even after application of voltage thereto for more than 5.5 minutes, thus making it possible to maintain the predetermined state of discharge.

It should be noted here that in the CR composite part according to the present invention as described so far, the resistant layers 17-1 and 17-2 may be omitted depending on requirement, while the arrangement may be modified, for example, in such a manner that a plurality of capacitor forming electrodes confronting one another through the substrate are provided on opposite surfaces of the substrate, and the predetermined electrodes on the same surface of said substrate are connected through resistors, while the predetermined electrodes on one surface of the substrate are connected with the corresponding predetermined electrodes on the other surface thereof, thereby to form the CR composite circuit by the plurality of capacitors and plurality of resistors.

Figure 9:
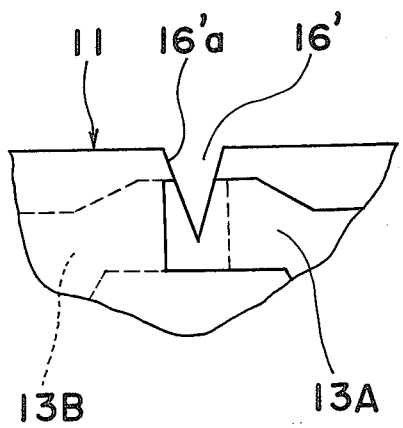
FIG. 9 is a fragmentary top plan view showing an essential portion of a CR composite part according to a modification of the arrangement of FIG. 3.

Referring further to FIG. 9, there is shown a modification of the CR composite part of FIGS. 3 to 5. In this modification, the through-hole 16 described as provided in FIGS. 3 to 5 for the series connection of the capacitors C1 and C2 through the conductive paint applied to the inner peripheral surface of said through-hole 16, is replaced, for example, by a wedge-shaped notch 16' formed at one edge of the substrate 11 in a position corresponding to the through-hole 16 so as to electrically connect both of the electrodes 13A and 13B through the electrically conductive paint (not shown) applied onto the inner edge 16'a of said notch 16'.

Needless to say, an electrically conductive metallic foil or the like may be employed instead of the conductive paint so far as the electrical connection between the electrodes 13A and 13B is established thereby.

Although not particularly shown, the arrangement of FIGS. 3 to 5 may further be so modified that the electrodes 13A and 13B are electrically connected through a metallic clip applied onto the edge portion of the substrate 11 so as to hold said substrate therebetween for conduction of the electrodes 13A and 13B, and in this case, the through-hole 16 or the notch portion 16' may be omitted.

It should also be noted that, in the embodiment as described so far, although the electrodes provided on the opposite surfaces of the substrate 11 are illustrated to have the similar shapes, the configurations of such electrodes need not necessarily be the same, but may be altered in various ways within the scope.

As is clear from the foregoing description, according to the present invention, since it is so arranged that, one of the discharge electrodes is provided on one surface of the substrate made of a dielectric material and formed with the CR composite circuit, with the other discharge electrode being formed on the other surface of said substrate, while the through-opening is formed at the discharge gap in the substrate, entry of foreign matters in the discharge gap due to adhesion of dust and dirts, etc. in the atmosphere, may be positively prevented. Accordingly, such inconveniences that the discharge starting voltage in the CR composite circuit having the discharge gap is unnecessarily lowered or varied, or abnormal heat is produced by the presence of such foreign matters, can be fully eliminated, thus making the protective function of the CR composite part of the present invention highly reliable.

Moreover, owing to the arrangement in the present invention in which the dielectric material of the substrate is removed at the dischage gap by forming the through-opening therein, undesirable formation of floating capacity between both of the discharge electrodes may be prevented, with a consequent elimination of undue drop of the discharge starting voltage based on such floating capacity. Furthermore, since the discharge path is formed from the discharge electrode on one surface of the substrate towards the discharge electrode on the other surface of said substrate, a compact CR composite part with a discharge gap, having a high discharge starting voltatge, may be constituted at low cost, without necessity for expansion of the interval between the discharge electrodes on the substrate or provision of a particular voltage withstanding means.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A CR composite part provided with discharge gap, which comprises a substrate (11) of dielectric material, a plurality of capacitor-forming electrodes (12A, 13B, 13A, 12B) respectively provided on opposite surfaces of the substrate so as to confront each other through said substrate held therebetween, a CR composite circuit constituted by bridging, through resistance, the predetermined electrodes (12A, 13A, 12B, 13B) of said plurality of capacitor-forming electrodes respectively provided on the same surfaces of said substrate and also by electrically connecting the one predetermined electrode (13A) on one surface of said substrate to the other predetermined electrode (13B) on the other surface of said substrate, and two discharge electrodes (12A2, 12B2) which are respectively provided on the opposite surfaces of the substrate and connected to the electrode (12A) on the one surface of the substrate and the electrode (12B) on the other surface of said substrate, equivalent to input and output terminals of said CR composite circuit, and which are respectively provided with discharge end portions (12A2a, 12B2a) arranged to confront each other through a predetermined gap (G) along the surfaces of said substrate, said substrate (11) being formed with an opening (15) at a position equivalent to the gap (G) between said two discharge electrodes.

2. A CR composite part as claimed in claim 1, wherein said resistance through which said predetermined electrodes (12A, 13A, 12B, 13B) are bridged each other are resistor layers having predetermined resistance values.

3. A CR composite part as claimed in claim 1, wherein said one predetermined electrode (13A) on the one surface of the substrate and said the other predetermined electrode (13B) on the other surface of said substrate are electrically connected to each other through a through-hole (16) formed in a position where end portions (13Aa, 13Ba) of said one and the other predetermined electrodes (13A, 13B) are overlapped each other through said substrate and an electrically conductive paint applied onto inner peripheral surface of said through-hole.

4. A CR composite part as claimed in claim 1, wherein said one predetermined electrode (13A) on the one surface of the substrate and said the other predetermined electrode (13B) on the other surface of said substrate are electrically connected to each other through a through-hole (16) formed in a position where end portions (13Aa, 13Ba) of said one end and the other predetermined electrodes (13A, 13B) are overlapped each other through said substrate and an electrically conductive metallic foil applied onto inner peripheral surface of said through-hole.

5. A CR composite part as claimed in claim 1, wherein said one predetermined electrode (13A) on the one surface of the substrate and said the other predetermined electrode (13B) on the other surface of said substrate are electrically connected to each other through a through-hole (16) formed in a position where end portions (13Aa, 13Ba) of said one and the other predetermined electrodes (13A, 13B) are overlapped each other through said substrate and an electrically conductive eyelet ring applied onto inner peripheral surface of said through-hole so as to be staked on said electrodes (13A, 13B).

6. A CR composite part as claimed in claim 1, wherein said one predetermined electrode (13A) on the one surface of the substrate and said the other predetermined electrode (13B) on the other surface of said substrate are electrically connected to each other through a notched portion (16′) in a wedge like configuration formed at one edge of said substrate in a position where end portions (13Aa, 13Ba) of said one and the other predetermined electrodes (13A, 13B) are overlapped through said substrate, and an electrically conductive paint applied onto inner peripheral surface of said notched portion.

7. A CR composite part as claimed in claim 1, wherein said one predetermined electrode (13A) on the one surface of the substrate and said the other predetermined electrode (13B) on the other surface of said substrate are electrically connected to each other through a notched portion (16′) in a wedge like configuration formed at one edge of said substrate in a position where end portions (13Aa, 13Ba) of said one and the other predetermined electrodes (13A, 13B) are overlapped through said substrate, and an electrically conductive metallic foil applied onto inner peripheral surface of said notched portion.

8. A CR composite part as claimed in claim 1, wherein said one predetermined electrode (13A) on the one surface of the substrate and said the other predetermined electrode (13B) on the other surface of said substrate are electrically connected to each other by a clip member applied to the side edge of the substrate for conduction therebetween.

9. A CR composite part as claimed in claim 1, wherein said opening (15) formed in said substrate at a position equivalent to the gap between said two discharge electrodes is a through-opening of a predetermined configuration.

10. A CR composite part as claimed in claim 1, wherein said opening (15) formed in said substrate at a position equivalent to the gap between said two discharge electrodes is a notch formed by cutting out said substrate at its side edge.

11. A CR composite part as claimed in claim 1, wherein said electrodes (12A, 12B) connected to said discharge electrodes (12A2, 12B2) and equivalent to the input and output terminals, are further connected with corresponding lead wires, with portions of said substrate excluding the discharge portion being coated with a resinous material through a dipping method and the like.

* * * * *